(12) United States Patent
Chen (10) Patent No.: US 6,229,860 B1
(45) Date of Patent: May 8, 2001

(54) CIRCUIT FOR ACCURATELY CONVERTING DIGITIZED ANALOG SIGNALS INTO DIGITAL SIGNALS

(75) Inventor: Jian-Jou Chen, Taipei (TW)

(73) Assignee: Amtran Technology Co., Ltd., San Chung (TW)

(*) Notice: Subject to any disclaimer, the term of this patent is extended or adjusted under 35 U.S.C. 154(b) by 0 days.

(21) Appl. No.: 09/175,426

(22) Filed: Oct. 20, 1998

(30) Foreign Application Priority Data

Aug. 4, 1998 (TW) .................................................. 87212761

(51) Int. Cl.$^7$ ....................................................... H04L 7/00
(52) U.S. Cl. ............................................ 375/355; 341/131

(58) Field of Search ...................................... 375/216, 355; 341/131, 108

(56) References Cited

U.S. PATENT DOCUMENTS 5,831,488 * 11/1998 Nakajima et al. ................... 332/144

* cited by examiner

*Primary Examiner*—Temesghen Ghebretinsae
(74) *Attorney, Agent, or Firm*—Bacon & Thomas, PLLC (57) ABSTRACT

A circuit for accurately converting digitized analog signals into digital signals, the circuit including a clock signal synthesizer which accepts a synchronizing signal and a frequency-indicating signal and outputs a clock signal CLK1 in accordance with the synchronizing signal and the frequency-indicating signal.

2 Claims, 7 Drawing Sheets

CIRCUIT FOR ACCURATELY CONVERTING DIGITIZED ANALOG SIGNALS INTO DIGITAL SIGNALS

BACKGROUND OF THE INVENTION

1. Field of the Invention

The present invention relates to a circuit for accurately converting digitized analog signals into digital signals, and more particularly to a circuit for converting digitized analog video signals into digital video signals served to a liquid crystal display (hereinafter referred as LCD) panel.

2. Description of the Prior Art

Figure 1:
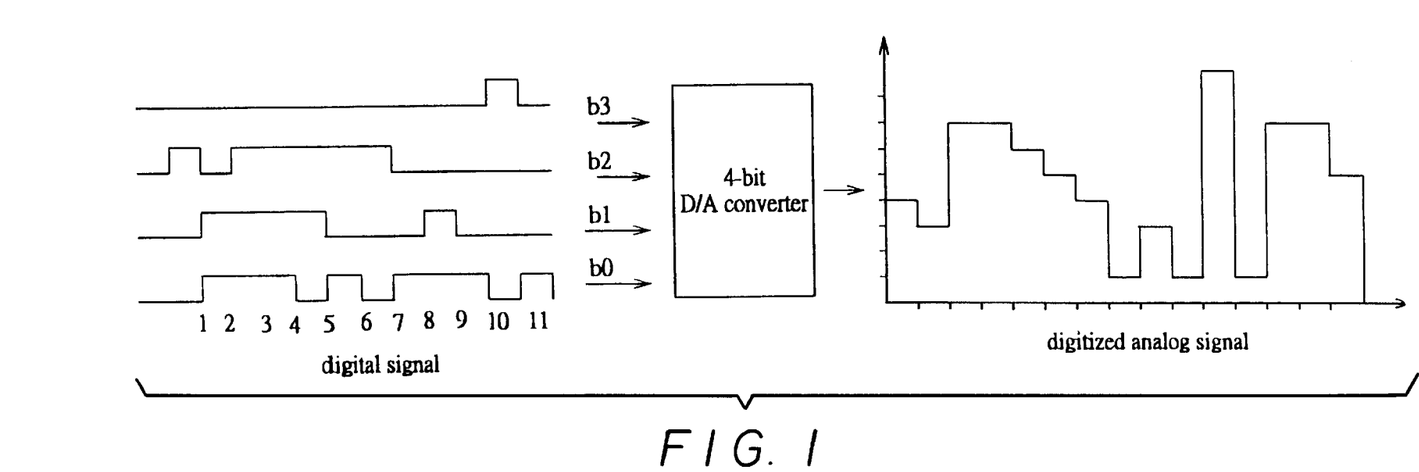
FIG. 1 illustrates a digitized analog signal.
Figure 1A:
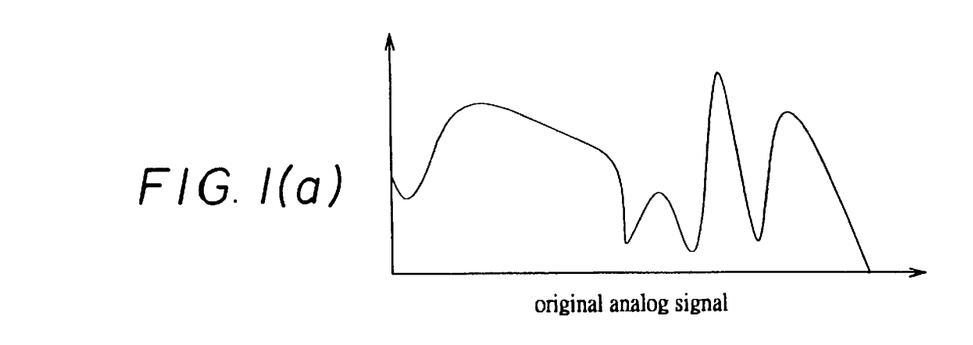
FIG. 1(a) illustrates an original analog signal.

Owing to the increasing functions of a personal computer, analog signals such as video signals or audio signals can be processed and modified by the multimedia unit of a computer, the processed digital signals must be reverted to analog signals by a D/A converter such that the signals can be received by a common speaker or a conventional CRT monitor. Such reverted analog signals are different from original analog signals, which as shown in FIG. 1(a), are referred as "digitized analog signals", as shown in FIG. 1.

If the digitized analog signals must be sampled again by some digital devices (devices that receive digital signals only, e.g. LCD panels) to be converted to digital signals, some conditions must be satisfied for the digitized analog signals to be accurately reverted to the original digital signals. Next, the video signals and the conditions that are applied to an LCD panel are used to exemplify the sampling process.

An LCD panel is a device which can only receive digital signals. However, video signals output from a display card of a common personal computer are digitized analog signals as stated in the above. When such video signals enter an LCD panel, an A/D converter must be used to perform sampling such that digital signals are obtained. If the sampling cannot be performed accurately or the sampling is performed ambiguously, the displayed picture will become distorted or unclear.

Figure 2:
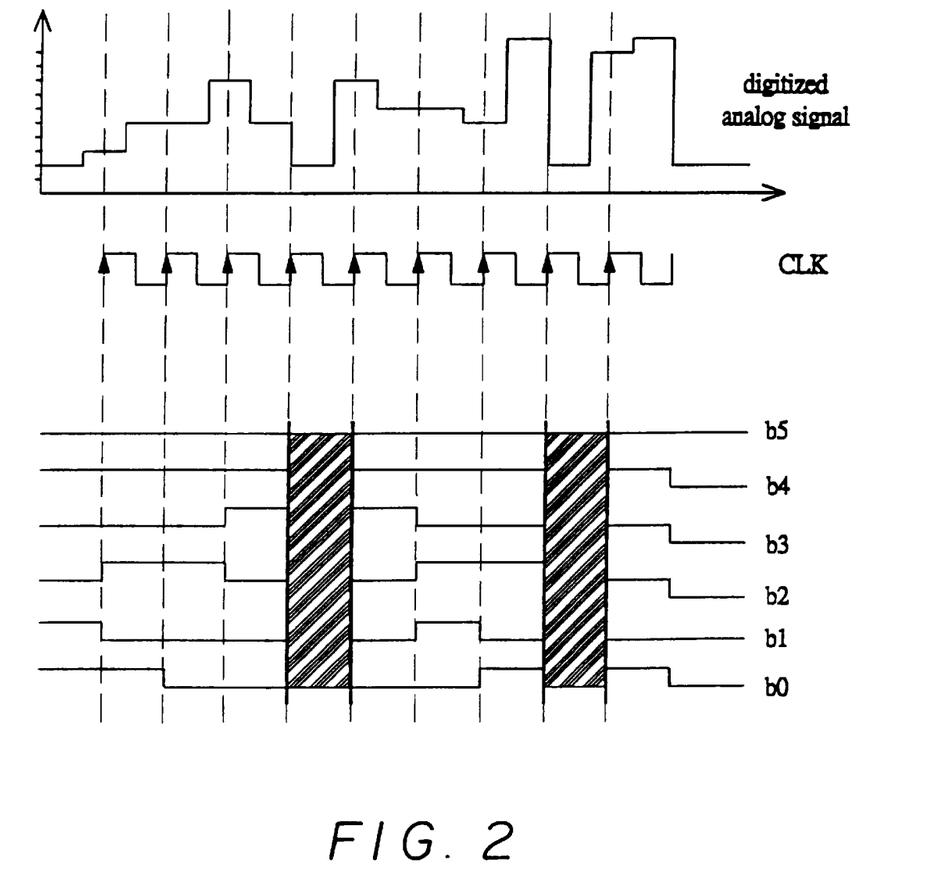
FIG. 2 illustrates the wrong digital signal resulting from an improper sampling clock.

Referring to FIG. 2, in which the sampling clock CLK (triggering at rising edges) is not a proper sampling signal, for not only does it cause the digital signal to become distorted (comparing the digital signal $b_0 b_1 b_2 b_3 b_4 b_5$ shown in the lower FIG. 2 with the digitized analog signal shown in the upper FIG. 2), but also produce some imprecise signals.

Figure 3:
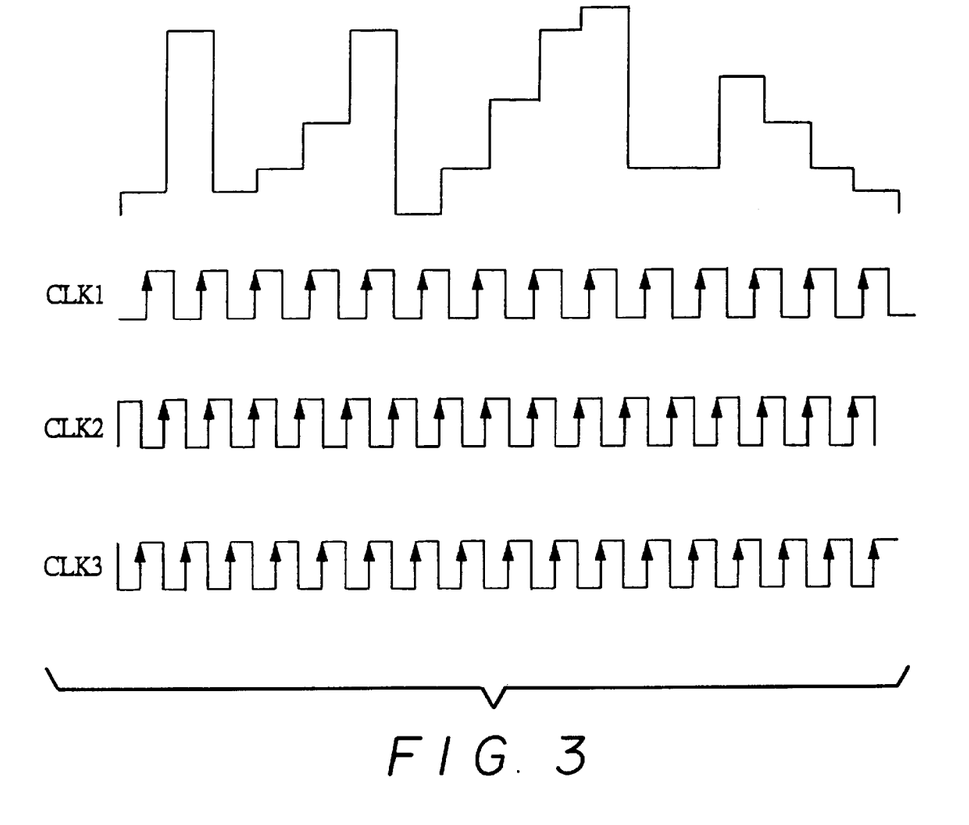
FIG. 3 illustrates a proper sampling clock.

FIG. 3 shows three different kinds of sampling clocks CLK1, CLK2 and CLK3, in which only CLK3 is an ideal sampling clock. This is illustrated in the following: the actuating points of CLK1 are not ideal, because ambiguous results are produced repetitively. Accordingly, the ambiguous results that are produced repetitively can be prevented only when the frequency of the sampling clock is the same as that of the original digital signal of the digitized analog signal. Although CLK2 satisfies the above conditions, but the actuating points of most digital electrical elements have limitations on setup time and hold time, and the requirements on setup time and hold time are different for different elements. In FIG. 3, the sampling points of CLK2 are at the changing edges of the signal. Thus, for an A/D converter, the sampled data may be signals that are before or after the change. Therefore the actuating points of the sampling are not ideal.

CLK3 is an ideal sampling clock, because a precise signal can be sampled by each of the actuating points of the sampling, and no signal is omitted. Thus it is a good sampling clock.

SUMMARY OF THE INVENTION

The object of the present invention is to provide a circuit for auto-searching a precise sampling clock for an A/D converter, and to prevent the signal from becoming distorted or ambiguous in the converting process.

Figure 4:
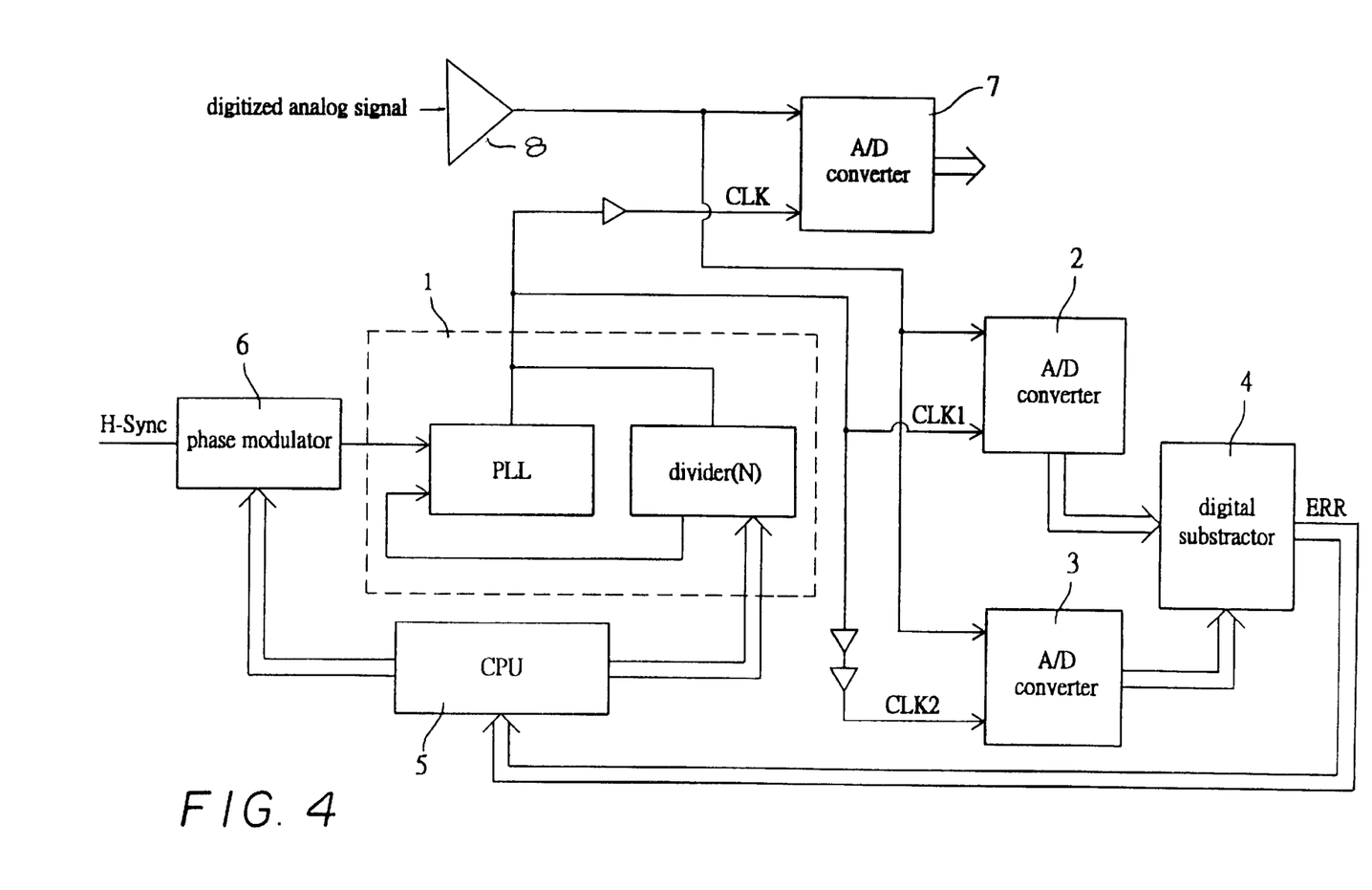
FIG. 4 is a block diagram showing the circuit according to the present invention for accurately converting a digitized analog signal into a digital signal.

Referring to FIG. 4, the circuit according to the present invention for accurately converting digitized analog signals into digital signals comprises: a clock signal synthesizer 1, an A/D converter 2, an A/D converter 3, a digital subtractor 4, a CPU 5, a phase modulator 6, and an A/D converter 7.

A clock signal synthesizer 1 accepts a synchronizing signal and a frequency-indicating signal, and outputs a clock signal CLK1 in accordance with the synchronizing signal and the frequency-indicating signal.

An A/D converter 2 accepts a digitized analog signal and the clock signal CLK1 output from the clock signal synthesizer 1, and converts the digitized analog signal into a first digital signal in accordance with sampling points of the clock signal CLK1;

An A/D converter 3 accepts the digitized analog signal and a clock signal CLK2 that is output from the clock signal synthesizer and then delayed by two buffers, and converts the digitized analog signal into a second digital signal in accordance with the sampling points of the delayed clock signal;

A digital subtractor 4 accepts the first digital signal and the second digital signal, and outputs their subtracted result.

A CPU 5 accepts an ERR signal output from the digital subtractor 4, outputs a frequency-indicating signal to the clock signal synthesizer in accordance with the ERR signal, and outputs a phase-indicating signal.

A phase modulator 6 accepts a horizontal synchronizing signal H-Sync and the phase-indicating signal output from the CPU 5, modulates the phase of said horizontal synchronizing signal H-Sync in accordance with the phase-indicating signal, and transfers the phase-modulated horizontal synchronizing signal to the clock signal synthesizer as its synchronizing signal; and An A/D converter 7 accepts the digitized analog signal and a clock signal output from the clock signal synthesizer and then delayed by one buffer, and outputs a digital signal that is the output signal of the whole circuit.

Figure 7:
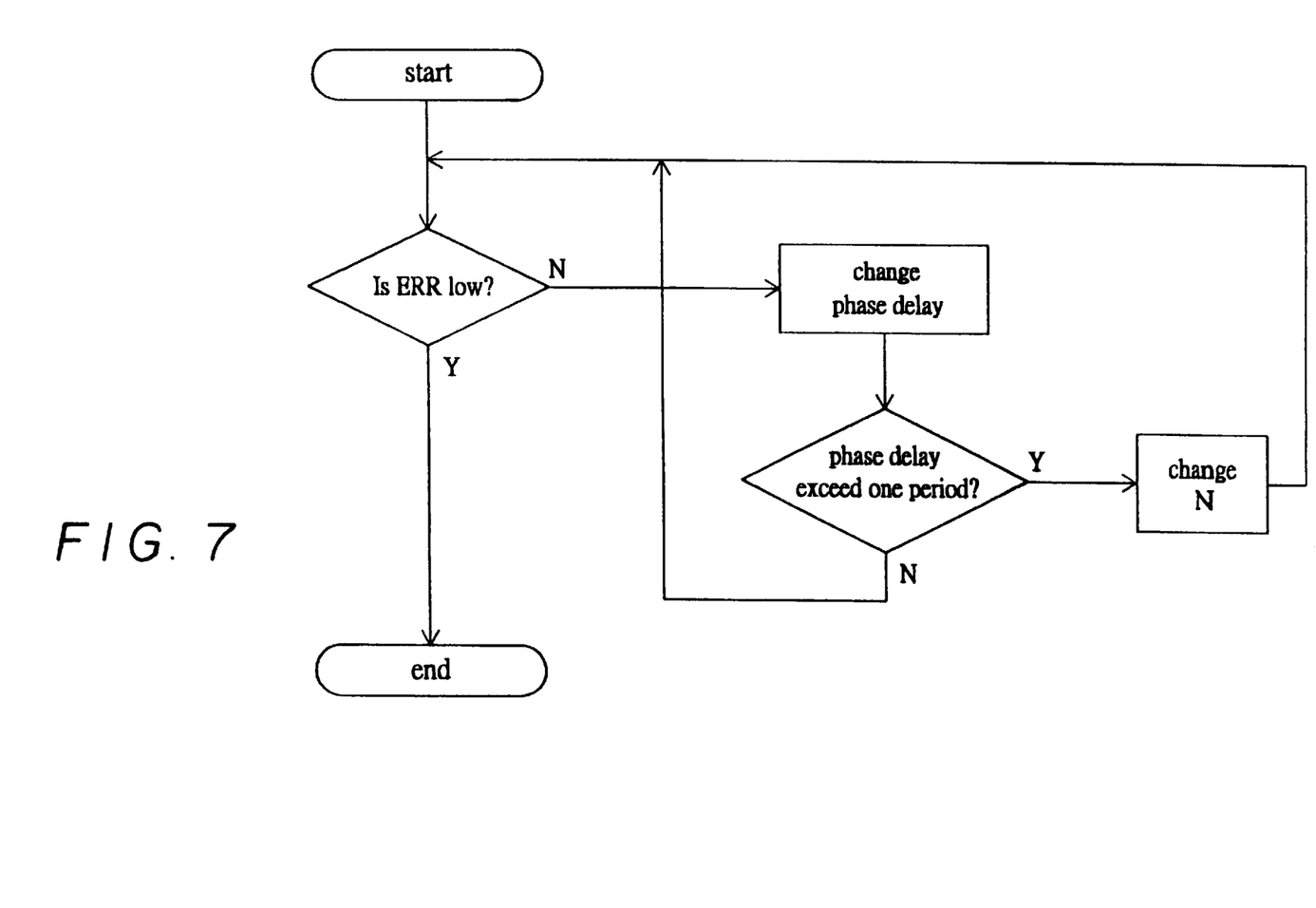
FIG. 7 is a flow chart showing the circuit according to the present invention.

Referring to FIG. 7, the circuit in FIG. 4 acts as the following:

(1) If the ERR signal output from the digital subtractor is in a low level, the digital signal output from the third A/D converter is desired; proceed to step (2) otherwise;

(2) The CPU emits a phase-indicating signal to the phase modulator for delaying the phase of the horizontal synchronizing signal H-Sync, and further delaying the phase of the clock signal CLK1 output from the clock signal synthesizer, then proceed to step (3);

(3) Check if the phase delay of the clock signal CLK1 has exceeded one period; if not, proceed to step (1); proceed to step (4) otherwise;

(4) The CPU emits the phase-indicating signal to clock signal synthesizer for changing the frequency of output clock signal CLK1, then return to step (1).

In addition, the circuit according to the present invention for accurately converting digitized analog signals into digital signals further comprises a pre-amplifier 8 for pre-amplifying the digitized analog signal, which then enters the third A/D converter 7.

DESCRIPTION OF THE PREFERRED EMBODIMENT

Referring to FIG. 4 again, the horizontal synchronizing signal H-Sync enters the clock signal synthesizer 1 as its synchronizing signal after being phase-modulated by the phase modulator 6. The synchronizing signal is frequency-multiplied by the clock signal synthesizer 1, then enters one buffer, and then enters the A/D converter 7 as its sampling clock, the digital signals output from the A/D converter 7 is the desired signal.

The N value of the divider (N) is controlled by the CPU 5, thereby the frequency of the sampling clock is determined (the frequency of the sampling clock=N*(the frequency of the horizontal synchronizing signal H-Sync)). With this configuration, one has to control not only the frequency of the sampling clock, but also the phase of the digitized analog signal and the horizontal synchronizing signal (that is, the phase relation between the digitized analog signal and the horizontal synchronizing signal) to sample the digitized analog signal into digital signal accurately.

To achieve the above object, one uses the following simple circuit to change the phase of the digitized analog signal and the horizontal synchronizing signal.

The digitized analog signal is accompanied by one horizontal synchronizing signal H-Sync, and the horizontal synchronizing signal has a fixed phase relation with respect to the digitized analog signal. In addition, as for the clock signal synthesizer 1, the phase of the output clock signal and the input horizontal synchronizing signal has a fixed relation, so if the phase relation between the horizontal synchronizing signal and the digitized analog signal is changed, the phase relation between the clock signal and the digitized analog signal output from the clock signal synthesizer 1 could be changed.

The phase modulator 6 is controlled by the clock signal synthesizer 1 as shown in FIG. 4, to adjust the phase of the horizontal synchronizing signal H-Sync. Then, the phase relation between the clock signal and the digitized analog signal output from the clock signal synthesizer 1 could be changed.

Figure 5:
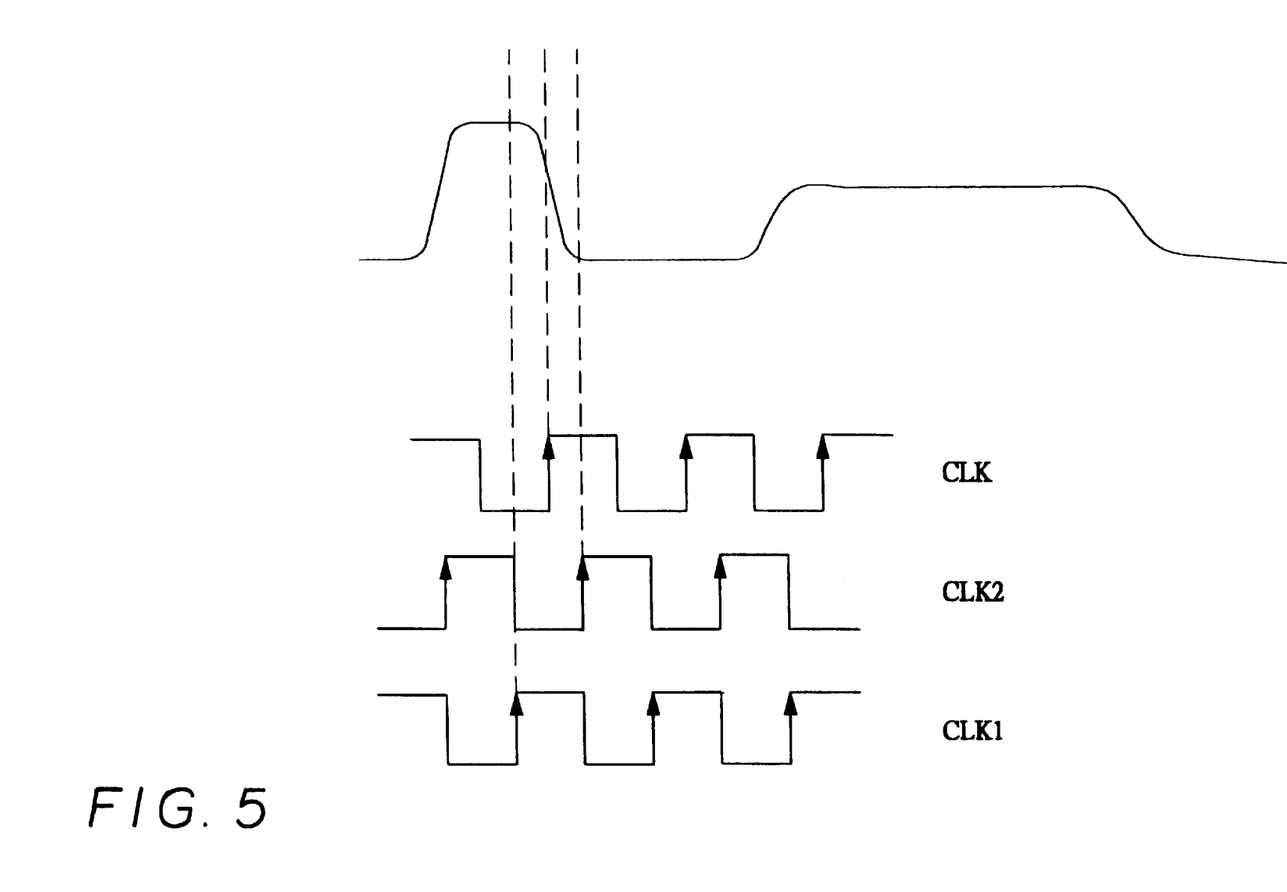
FIG. 5 and FIG. 6 illustrate the determination of whether the sampling clock is proper or not by the timing of CLK1 and CLK2.
Figure 6:
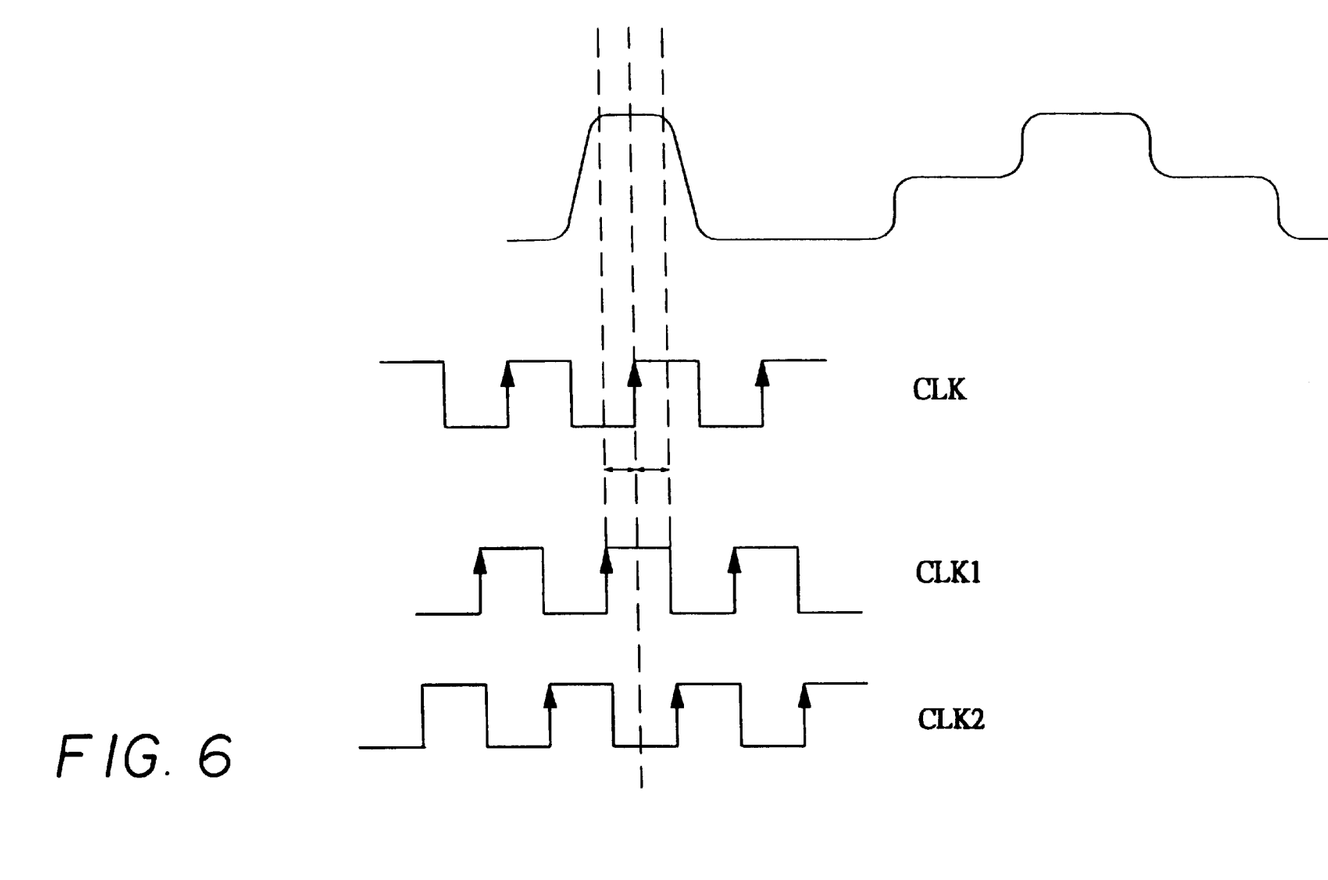

The clock signal CLK1 which is output from the clock signal synthesizer 1 shown in FIG. 4 is then input to the A/D converter 2 directly; and when processed by two buffers, becomes CLK2; and then it is input to the A/D converter 3; and when processed by one buffer, becomes CLK; and then it is input to the A/D converter 7. Assuming the delay time of one buffer is 3 ns, CLK1 is faster than CLK by 3 ns, and CLK2 is slower than CLK by 3 ns. As shown in FIG. 5, if the sampling point of the sampling clock CLK corresponds to the middle of a flat area of the digitized analog signal, then the values sampled by CLK1 and CLK2 are very close, and the output ERR of the subtractor 4 is "approximately zero". On the other hand, as shown in FIG. 6, if the sampling point of the sampling clock CLK corresponds to a changing edge of the digitized analog signal, then the values sampled by CLK1 and CLK2 may be considerably different, and the ERR values are quite large. Accordingly, one can use the ERR output from the subtractor 4 to determine whether the sampling point of the A/D converter 7 is proper or not.

ADVANTAGES OF THE INVENTION

The circuit for accurately converting digitized analog signals into digital signals according to the present invention has the following advantages:

1. One need not consider whether the setup time and hold time of the selected A/D converters are different or not, because the circuit compares the sampled values for the judgement;

2. The circuit functions normally even for an active digitized analog signal. It would not malfunction even if the digitized analog signal is very complicated. The margin of auto-adjustment is also drastically increased.

While the present invention has been described with reference to the specific embodiments, the description is only illustrative and is not to be construed as limiting the invention. Various modifications and applications can be made without departing from the spirit and scope of the following claims.

What is claimed is:

1. A circuit for accurately converting digitized analog signals into digital signals comprises:

a clock signal synthesizer, for accepting a synchronizing signal and a frequency indicating signal, and for outputting a clock signal CLK1 in accordance with said synchronizing signal and said frequency indicating signal;

a first A/D converter, for accepting a digitized analog signal and said clock signal CLK1 output from said clock signal synthesizer, and for converting said digitized analog signal into a first digital signal in accordance with the sampling points of said clock signal CLK1;

a second A/D converter, for accepting said digitized analog signal and a clock signal CLK2 that is output from said clock signal synthesizer and then delayed by two buffers, and for converting said digitized analog signal into a second digital signal in accordance with the sampling points of said delayed clock signal;

a digital subtractor, for accepting said first digital signal and second digital signal, and for outputting their subtracted result;

a CPU, for accepting an ERR (error) signal output from said digital subtractor, and for outputting a frequency-indicating signal into said clock signal synthesizer in accordance with said ERR signal and outputting a phase-indicating signal;

a phase modulator, for accepting a horizontal synchronizing signal H-Sync and said phase-indicating signal that is output from said CPU and modulating the phase of said horizontal synchronizing signal H-Sync in accordance with said phase-indicating signal, and for transferring said phase-modulated horizontal synchronizing signal to said clock signal synthesizer as its synchronizing signal; and a third A/D converter, for accepting said digitized analog signal and a clock signal that is output from said clock signal synthesizer and then delayed by one buffer, and for outputting a digital signal that is the output signal of the whole circuit, said circuit proceeds as the following:

(1) if the ERR signal output from said digital subtractor is low, the digital signal output from said third A/D converter is desired; proceed to step (2) otherwise;

(2) said CPU emits a phase-indicating signal to said phase modulator for delaying the phase of said horizontal synchronizing signal H-Sync, and further delaying the phase of said clock signal CLK1 output from said clock signal synthesizer, then proceed to step (3);

(3) check if the phase delay of said clock signal CLK1 has exceeded one period; if not, proceed to step (1); proceed to step (4) otherwise;

(4) said CPU emits said phase-indicating signal to said clock signal synthesizer for changing the frequency of output clock signal CLK1, then return to step (1).

2. The circuit for accurately converting digitized analog signals into digital signals according to claim 1, further comprises a pre-amplifier for pre-amplifying said digitized analog signal, which then enters said third A/D converter.

* * * * *